United States Patent
Lehtonen et al.

(10) Patent No.: US 7,362,562 B2
(45) Date of Patent: Apr. 22, 2008

(54) ELECTRONIC UNIT OF RADIO SYSTEM AND METHOD OF PRODUCING THE SAME

(75) Inventors: Pasi Lehtonen, Kempele (FI); Kimmo Huhtala, Oulu (FI)

(73) Assignee: Nokia Corporation, Espoo (FI)

( * ) Notice: Subject to any disclaimer, the term of this patent is extended or adjusted under 35 U.S.C. 154(b) by 156 days.

(21) Appl. No.: 10/463,865

(22) Filed: Jun. 18, 2003

(65) Prior Publication Data
US 2004/0034995 A1    Feb. 26, 2004

(30) Foreign Application Priority Data
Jun. 20, 2002    (FI)    ................... 20021218

(51) Int. Cl.
H01L 21/46    (2006.01)
H05K 3/30    (2006.01)

(52) U.S. Cl. .................. 361/679; 29/832; 29/834; 29/843; 257/719; 361/688

(58) Field of Classification Search ............ 29/832, 29/834, 837, 840, 842, 843, 759; 174/52.4, 174/252, 260; 228/180.21; 257/691, 702, 257/719, 712; 342/175; 361/676, 702, 763, 361/767, 679, 688
See application file for complete search history.

(56) References Cited

U.S. PATENT DOCUMENTS

| | | | |
|---|---|---|---|
| 4,724,514 A * | 2/1988 | Kaufman | 361/710 |
| 4,967,201 A * | 10/1990 | Rich, III | 342/175 |
| 5,291,063 A * | 3/1994 | Adishian | 257/718 |
| 5,663,597 A * | 9/1997 | Nelson et al. | 257/774 |
| 6,011,449 A * | 1/2000 | Jussaume et al. | 174/52.6 |
| 6,160,710 A * | 12/2000 | Ahl et al. | 361/707 |
| 6,235,991 B1 | 5/2001 | Johnson | 174/70 |
| 6,276,593 B1 | 8/2001 | Artaki et al. | 228/180.21 |
| 6,504,445 B1 * | 1/2003 | Kocharyan | 333/1.1 |
| 6,865,074 B2 * | 3/2005 | Lehtonen et al. | 361/679 |
| 2001/0012198 A1 | 8/2001 | Ketonen | 361/704 |
| 2001/0038310 A1 | 11/2001 | Olofsson et al. | 330/66 |

FOREIGN PATENT DOCUMENTS

EP    0 763 843 A2    3/1997

* cited by examiner

Primary Examiner—Donghai D. Nguyen
(74) Attorney, Agent, or Firm—Squire, Sanders & Dempsey L.L.P.

(57) ABSTRACT

The invention relates to a method of producing an electronic unit of a radio system automatically, an electronic unit of a radio system and an electronic component. The method of producing an electronic unit of a radio system automatically comprises mounting (802) the electronic component automatically in a hole provided for the electronic component in the circuit board using alignment means of the electronic component and alignment means of the circuit board, which align electric connecting means of the electronic component against electric connecting means on the circuit board; soldering (804) the electric connecting means of the electronic component automatically to the electric connecting means of the circuit board; and attaching (806) the electronic component automatically to the mechanical part so that the electronic component is in contact with the mechanical part, in which case the electronic component is cooled via the mechanical part.

26 Claims, 5 Drawing Sheets

ELECTRONIC UNIT OF RADIO SYSTEM AND METHOD OF PRODUCING THE SAME

BACKGROUND OF THE INVENTION

1. Field of the Invention

The invention relates to a method of producing an electronic unit of a radio system automatically, an electronic unit of a radio system and an electronic component used for producing the electronic unit of the radio system.

2. Description of the Related Art

In modern radio technology, the production of different electronic units and components has been automated as far as possible to obtain, on one hand, savings in costs and, on the other hand, to ensure uniform quality of the properties of the produced devices. In automatic production, the decrease of the number of manual stages or their omission altogether improves the uniform quality, in which case quality variation due to manual work can be reduced in connection with soldering, for example.

The capacities used in radio technology typically cause heating of devices and components. For this reason, it is necessary to cool the components to be used effectively, in particular high-power components. This can be performed, for example, by connecting a component to a mechanical part of the electronic unit. However, also in this case, the electric connecting means of the component have to be attached to the surface of a circuit board.

In prior art solutions, the problem has been solved by mounting an electronic component in an opening provided in a circuit board, in which case the component can be attached to the mechanical part and electric connecting means can be attached to the electric connecting means provided on the surface of the circuit board. A drawback of this solution is that it cannot be implemented automatically, using e.g. SMD mounting (Surface Mounted Device, SMD) and automatic screwing, but the stages have to be performed manually, after which solder joints are made manually onto the circuit board and the equipped circuit board is attached manually by screws. The manual stages increase production costs and constitute a significant cost item in the production of large series, in particular. A further problem is that due to the manual stages, the properties of electronic units, e.g. high-frequency properties, vary. For example, when a solder joint is made manually, the amount of solder varies, which affects the high-frequency properties. The mounting accuracy of the components on the circuit board may also vary from one time to another, in which case alignment of the electric connecting means and thus the high-frequency properties also vary.

SUMMARY OF THE INVENTION

The object of the invention is to provide an improved method of producing an electronic unit of a radio system automatically, an automatically produced electronic unit of the radio system, an electronic component used for producing the electronic unit of the radio system and an electronic unit of the radio system produced automatically by the method.

An aspect of the invention relates to a method of producing an electronic unit of a radio system automatically, the electronic unit comprising a mechanical part, a circuit board attached to the mechanical part and an electronic component connected to the circuit board, the method comprising mounting the electronic component automatically in an opening provided for the electronic component in the circuit board using alignment means of the electronic component and alignment means of the circuit board, which align electric connecting means of the electronic component against electric connecting means on the circuit board; soldering the electronic connecting means of the electronic component to the electronic connecting means of the circuit board automatically; and attaching the electronic component automatically to the mechanical part so that the electronic component is in contact with the mechanical part, in which case the electronic component is cooled via the mechanical part.

An aspect of the invention relates to an automatically produced electronic unit of a radio system, which comprises a mechanical part, a circuit board attached to the mechanical part and an electronic component connected to the circuit board, and which is automatically mounted in an opening provided for the electronic component in the circuit board by alignment means of the electronic component and alignment means of the circuit board, which align electric connecting means of the electronic component against electric connecting means on the circuit board; and the electric connecting means of the electronic component are automatically soldered to the electric connecting means of the circuit board; and the electronic component is automatically attached to the mechanical part so that the electronic component is in contact with the mechanical part, in which case the electronic component is cooled via the mechanical part.

An aspect of the invention relates to an electronic component which is used for producing an electronic unit of a radio system and which has to be attached to a mechanical part of the electronic unit to ensure cooling, the electronic component being automatically mountable in an opening provided for the electronic component in a circuit board using alignment means of the electronic component and alignment means of the circuit board, which align electric connecting means of the electronic component against electric connecting means on the circuit board; in which case the electric connecting means of the electronic component are automatically solderable to the electric connecting means of the circuit board; and the electronic component is automatically attachable to the mechanical part so that the electronic component is in contact with the mechanical part, in which case the electronic component is cooled via the mechanical part.

A further aspect of the invention relates to an electronic unit of a radio system, which comprises a mechanical part, a circuit board connected to the mechanical part and an electronic component connected to the circuit board and which is produced by a method which comprises mounting the electronic component automatically in an opening provided for the electronic component in the circuit board using alignment means of the electronic component and alignment means of the circuit board, which align electric connecting means of the electronic component against electric connecting means on the circuit board; soldering the electric connecting means of the electronic component to the electric connecting means on the circuit board; and attaching the electronic component automatically to the mechanic part so that the electronic component is in contact with the mechanic part, in which case the electronic component is cooled via the mechanic part.

The preferred embodiments of the invention are disclosed in the dependent claims.

The basic idea of the invention is that the method enables implementation of an electronic unit of a radio system which can be cooled by connecting its electronic component that requires cooling to the mechanical part of the electronic unit, while all production stages of the electronic unit can be performed automatically.

The invention provides several advantages. In addition to savings in costs and fastness, the automatic production has the advantage that the quality of electronic units to be produced can be kept uniform. For example, the amount of solder used in electronic connections and how well the mounting of the component on the circuit board succeeds affect the high-frequency properties of the produced electronic unit. The invention allows to keep the amount of solder constant and ensure the mounting of the component on the circuit board, in which case electronic units with uniform quality can be produced.

BRIEF DESCRIPTION OF THE DRAWINGS

The invention will now be described in greater detail by means of preferred embodiments, with reference to the accompanying drawings, in which.

DETAILED DESCRIPTION OF THE PREFERRED EMBODIMENTS

An example of an automatically produced electronic unit of a radio system will be described with reference to FIGS. 1a to 1e. The radio system where the electronic unit can be used may be a radio system according to the UMTS system (Universal Mobile Telecommunications System) applying the third-generation WCDMA technology (Wideband Code Division Multiple Access, a '2.5-generation' GSM/GPRS radio system (Global System for Mobile Communications, GSM) applying the GPRS technology (General Packet Radio System), or a radio system applying the second-generation GSM technology, or a hybrid of these, for example. The electronic unit of the radio system may be, for example, a unit of the base station or another electronic unit used in the radio system. The embodiments are not, however, limited to the systems and electronic units described by examples but a person skilled in the art may also apply the solution of the invention to other radio systems and electronic units they include.

Figure 1A:
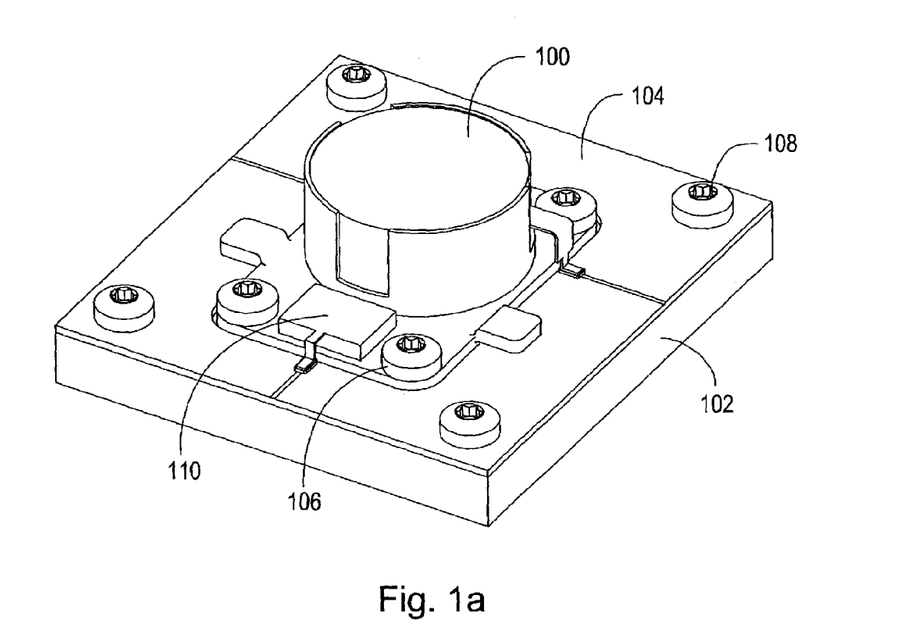
FIGS. 1a to 1e illustrate an example of an electronic unit of a radio system.

According to FIG. 1a, the automatically produced electronic unit of the radio system comprises a mechanical part 102, a circuit board 104 attached automatically to the mechanical part 102 and an electronic component 100 soldered automatically to the circuit board 104 and attached automatically to the mechanical part 102. The electronic unit is implemented in such a manner that all attachments and solder joints can be made automatically. The attachment of the circuit board 104 to the mechanical part is typically implemented automatically by means of a screwing robot using screws 108, for instance. The attachment of the electronic component 100 to the mechanical part 102 is typically also implemented automatically by means of a screwing robot using screws 106, for instance. The attachments can also be implemented in another way using clips or clamps, for example.

Figure 1B:
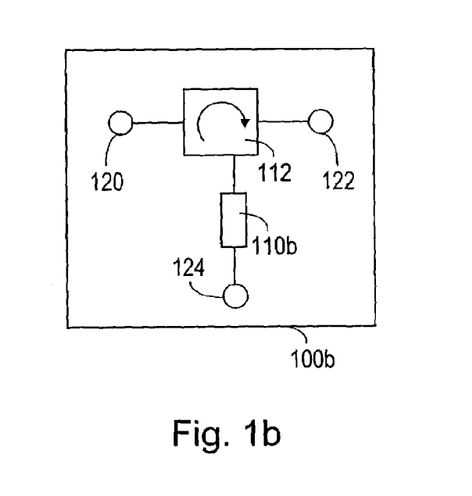
Figure 1C:
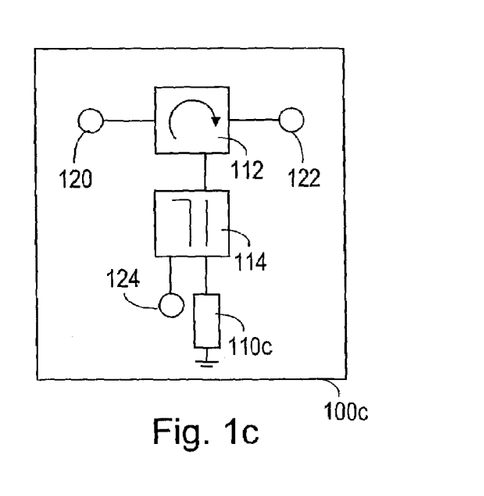

In our example according to FIG. 1b or 1c, the electronic component 100 is a circulator device 100b, 100c, which comprises a component that needs to be cooled, i.e. a high-power attenuator 110b or a high-power terminator 110c and a circulator component 112. The circulator device illustrated in our example is often briefly called a circulator. Attenuators are components which allow only a certain part of power to pass through them and absorb the rest of the power. Circulators are typically three-port components where the power supplied to the first port exits from the second port, the power supplied to the second port exits from the third port and the power supplied to the third port exits from the first port. However, the circulators may also comprise more than three ports.

According to FIG. 1b, the circulator 100b used in our example may comprise a three-port circulator 112 and a high-power attenuator 110b connected to it. As shown in FIG. 1c, the circulator 100c may also comprise a directional switch 114, which is connected to the three-port circulator 112 and to which a high-power terminator 110c is connected. A sample of reflected power can be taken from the output power of the high-power attenuator 110b as in the case of FIG. 1b or from the output power of the directional switch 114 as in the case of FIG. 1c. The circulator device 100b, 100c comprises an input port 120, an output port 122 and a third port, i.e. a sample port 124, through which the sample of reflected power can be taken.

Figure 1D:
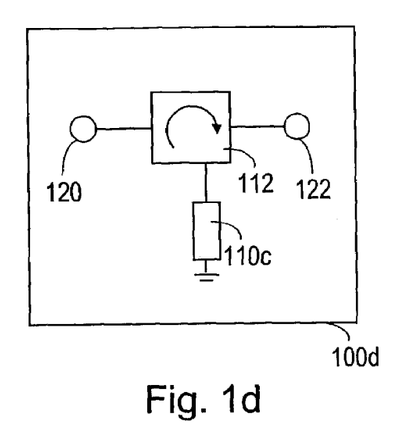
Figure 1E:
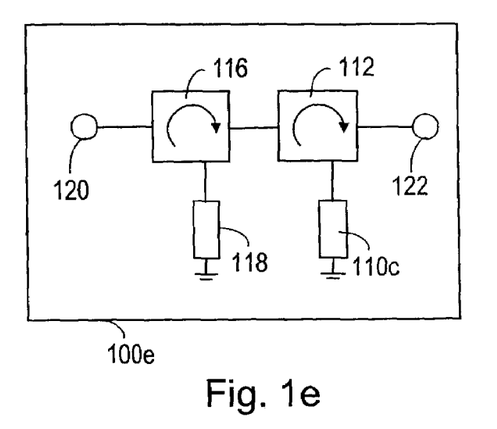

The electronic component 100 may also be an isolator 100d of FIG. 1d, which comprises a high-power terminator 110c and allows power to pass through only in one direction. The isolator 100d can be implemented by a three-port circulator 112 whose third port terminates in a high-power terminator 110c. In the isolator, power can pass through only in the conducting direction where the attenuation is lowest, whereas power propagating in the non-conducting direction is absorbed into the terminator 110c included in the isolator 100d. The isolator 100d also comprises an input port 120 and an output port 122.

Circulators and isolators are used to separate the functional blocks of a radio system from one another and to prevent propagation of reflected power. Circulators and isolators are typically used in power amplifiers, for example.

The circulator 100b, 100c or the isolator 100d described above are examples of components that require cooling. They are typically high-frequency components comprising above-mentioned attenuators or terminators, for instance. If a higher isolation level is to be obtained, the circulator device 100b, 100c or the isolator 100d can be provided, as the isolator 100e shown in FIG. 1e, with a second circulator component 116, whose one port is connected to the second circulator component 112 and one port to a low-power terminator 118. The circulator device 100b, 100c can be correspondingly provided with a second circulator and a low-power terminator. In addition to the circulator device or isolator, the electronic component 100 may also be another component used in the electronic unit of the radio system, for example a high-power amplifier, a power resistor or a power transistor.

Figure 2:
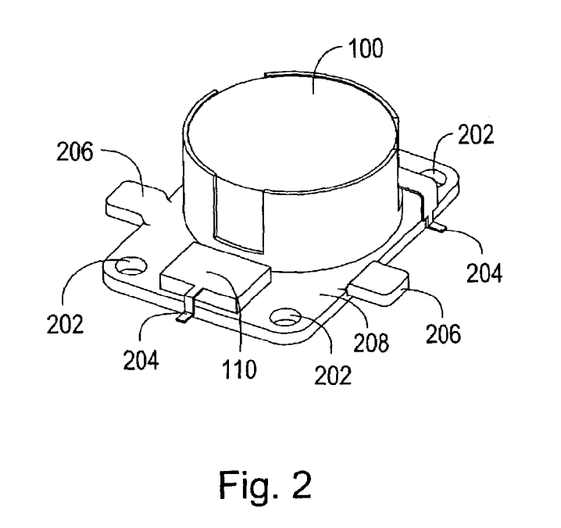
FIG. 2 illustrates an example of an electronic component included in the electronic unit of the radio system.
Figure 3:
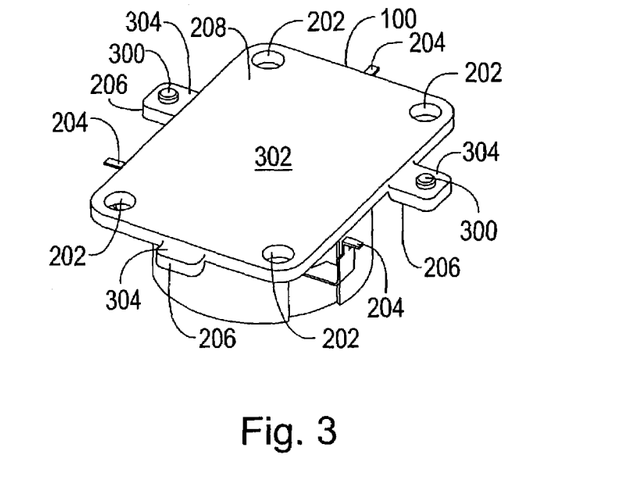
FIG. 3 is a bottom view of the electronic component included in the electronic unit of the radio system.

The electronic component 100 will now be described in greater detail by means of FIGS. 1a, 2 and 3. In addition to the attenuator 110 or terminator 110, the electronic component 100 comprises a substrate 208 and holes 202, which are provided in the substrate 208 and through which the electronic component 100 is attached to the mechanical part 102 by means of screws 106. The electronic component 100 comprises electric connecting means 204, which in our example are wire legs 204, by means of which the component is connected to the electronics of the circuit board 104. The electric connecting means 204 for the electronic component may also be connecting pins. The electronic component 100 also comprises ears 206, on which the electronic component 100 rests before it is attached to the mechanical part 102. As appears from FIG. 3, the electronic component 100 comprises alignment means 300 of the electronic component 100, which are located in the ears 206 included in the electronic component. In our example, the alignment means 300 are taps 300 projecting towards the circuit board 104, but they may alternatively be other alignment means than taps 300, for example holes that go through the substrate 208 of the electronic component 100 or notches provided in the substrate 208. In the example of FIG. 3, the electronic component 100 comprises three ears 206, of which two comprise alignment means 300 of the electronic component 100, i.e. taps 300, while one ear 206 functions as a support. The number of ears 206 as well as that of alignment means 300 may differ from what is described by the example.

Figure 6:
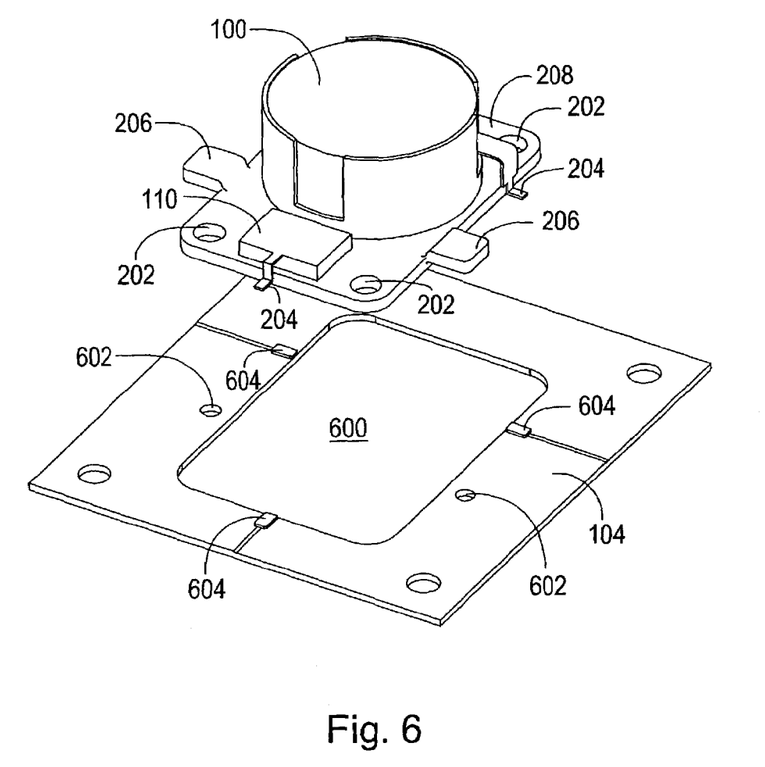
FIG. 6 illustrates an example of the electronic component included in the electronic unit of the radio system and the circuit board.

The circuit board 104, mechanical part 102 and electronic components 100 and the entity they form will now be described in greater detail by means of FIGS. 1a and 6. The electronic component 100 to be cooled comprises an attenuator 110 or a terminator 110 which requires cooling. When high capacities are used, the component has to be cooled effectively, which is in our example implemented by connecting the electronic component 100 to the mechanical part 102, which includes cooling means (not shown in the figure). Different cooling structures (not shown in the figures) are typically used as cooling means. These include different cooling ribs, which are based on as large a cooling area of the cooler as possible. The cooling ribs may be shaped as ribs, spikes or springs, for instance. The cooling capacity of the cooling means can be improved using a fan or materials with a better heat conductivity, for example. FIG. 6 illustrates a situation where an automatic paste printing step has been performed on the circuit board 104, after which the electric connecting means 604 of the circuit board 104, i.e. connecting areas 604 or pads 604, are provided with the amount of solder paste needed in soldering. FIG. 6 shows an opening 600 provided in the circuit board 104 where the electronic component 100 is mounted automatically, i.e. the electronic component 100 is mounted automatically on the circuit board 104 using e.g. a mounting robot, which may be a surface mounted component, i.e. an SMID mounting machine (Surface Mounted Device). In addition to the closed opening shown in FIG. 6, the opening may also be a partly open opening at an edge of the circuit board 104, in which case the opening has only three sides. The circuit board 104 also comprises alignment means 602 for circuit board 104, which are holes 102 provided in the circuit board 104, where the alignment means 300 of the electronic component 100 can be arranged. When the electronic component 100 is mounted on the circuit board 102, the alignment means 300 and alignment means 602 align the wire legs 204 of the electronic component 100 against the pads 604 on the circuit board 104. The holes 602 may alternatively be alignment means of other kind, for example notches in the circuit board 104, provided that they can be mounted in the alignment means 300 of the electronic component 100. The number of alignment means 602 of the circuit board 104 corresponds to the number of alignment means 300 of the electronic component 100. In our example, both the electronic component 100 and the circuit board 104 have two alignment means but their number may naturally differ from this.

The opening 600 is preferably slightly larger than the substrate 208 of the electronic component 100. The ears 206 included in the electronic component 100 extend beyond the edges of the opening 600 provided in the circuit board 104. When the electronic component 100 is arranged in the opening 600, it rests on top of the circuit board 104 on the ears 206, which keep the electronic component 100 in place with respect to the circuit board 104 until the electronic component 100 is connected to the mechanical part 102 shown in FIG. 1a.

Next the electric connecting means 204, i.e. wire legs, included in the electronic component 100 are connected to the electronics of the circuit board 104 using electric connecting means 604, i.e. pads 604. The electric connecting means are connected to each other by automatic soldering. In our example, the electronic component 100 comprises three wire legs 204, and the circuit board 104 correspondingly comprises three pads 604. Two electric connecting means 204 provided directly in the electronic component 100 attach the electronic component 100 to two electric connecting means 604 of the circuit board 104, i.e. to pads 604. The attenuator 110 of the electronic component 100 further comprises one wire leg 204, which connects the attenuator 110 to the electronics of the circuit board 104 by means of the pad 604 of the circuit board 104.

Figure 4:
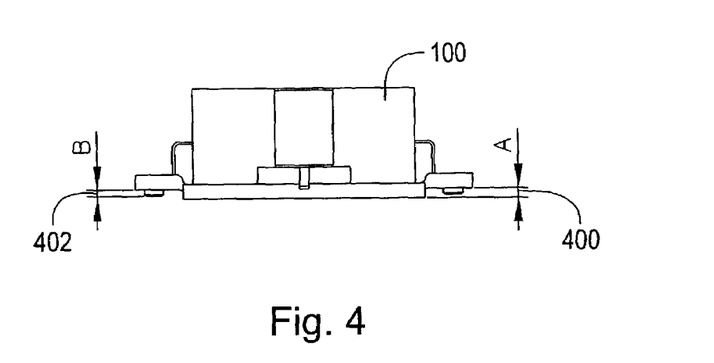
FIG. 4 is a side view the electronic component included in the electronic unit of the radio system.
Figure 5:
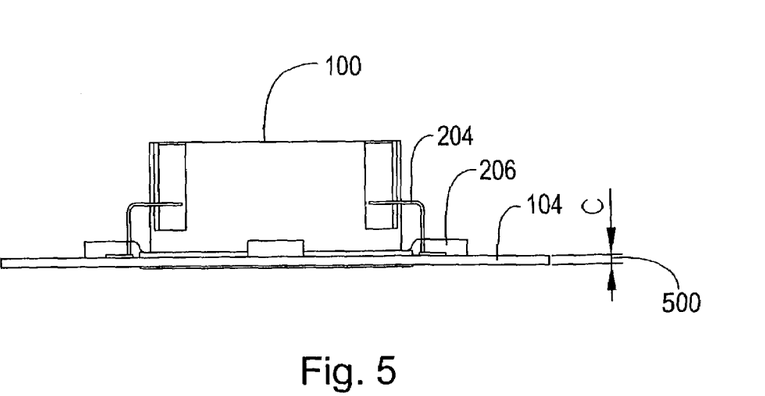
FIG. 5 illustrates an example of the electronic component included in the electronic system which is soldered to a circuit board.

It appears from FIGS. 3, 4 and 5 that, in our example, the distance 400 of the ear, i.e. dimension A, which is the distance of the ear 206 from the surface towards the circuit board 104, i.e. from the bottom surface of the ear 206 to the edge of bottom surface 302 of the substrate 208 towards the circuit board, is greater than the thickness 500 of the circuit board 104, i.e. dimension C. In that case, the problems caused by dimensional tolerances of the circuit board can be eliminated, i.e. it can be ensured that the electronic component 100 will always be in contact with the mechanical part 102 and heat can be conducted away from the electronic component 100. Dimension B shown in FIG. 4, i.e. the tap length 402, is at most as great as dimension A, i.e. the distance 400 of the ear, and preferably smaller, in which case the tap 300 does not touch the mechanical part 102 after the assembly. If the taps 300 extended below the substrate 208 of the electronic component 100, the mechanical part 102 would primarily cool the taps 300 and thus the electronic component 100 would not be cooled effectively. In practical applications, dimension C, i.e. the thickness of the circuit board 104, is typically also greater than dimension B, i.e. the tap length 402.

FIG. 5 illustrates a situation where the electronic component 100 has gone through the soldering step and rests on ears 206 on top of the circuit board 104. When dimension A, i.e. the distance 400 of the ear, is greater than the thickness 500 of the circuit board 104, i.e. dimension C, the surface that will be against the mechanics on the substrate 208 of the electronic component 100 is at this stage lower than the surface that will be against the mechanics of the circuit board 104. In soldering, the wire legs 204 of the electronic component 100 are connected to the electronics of the circuit board 104 using the pads 604 of the circuit board 104. Soldering is performed automatically using reflow soldering or a reflow oven, for example. In the oven, tin paste melts and thus attaches the electric connecting means 204 of the electronic component 100 to the electric connecting means 604 of the circuit board 104.

Figure 7:
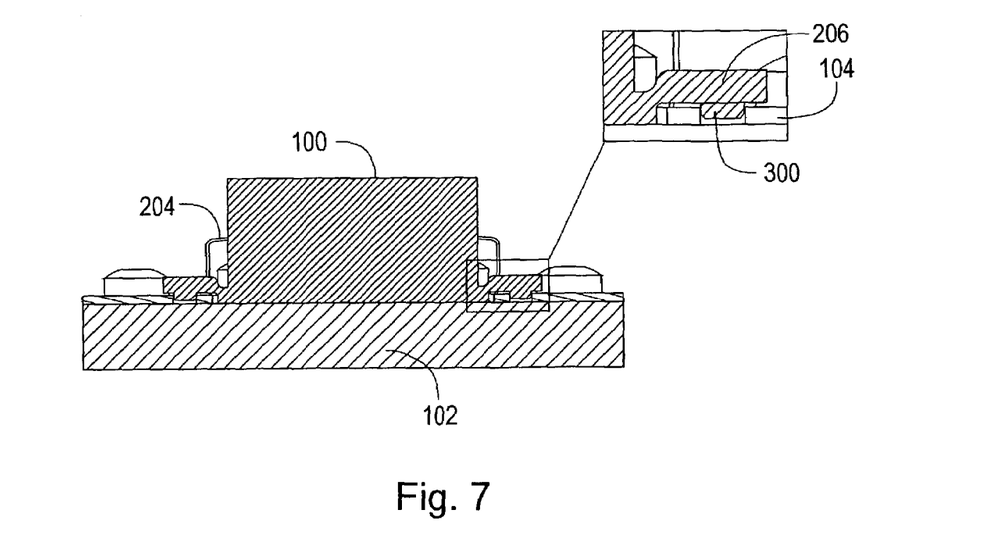
FIG. 7 is a cross-sectional view of the electronic unit of the radio system.

FIG. 7 illustrates an entity formed by the electronic component 100 and the circuit board 104. The entity is finally attached automatically to the mechanical part 102. The attachment can be performed using a screwing robot, for instance. In connection with the attachment, the electronic component 100 is pressed tightly against the cooling mechanical part 102. When the distance 400 of the ear (dimension A) is greater than the thickness 500 of the circuit board 104 (dimension C), the bottom surface 302 of the substrate 208 in the electronic component 100 (see FIG. 3) is lower before assembly to the mechanical part 102 than the bottom surface of the circuit board 104. During the assembly, the bottom surface of the circuit board and the bottom surface 302 of the substrate 208 in the electronic component 100 will be arranged on the same level against the mechanical part 102, in which case the electronic component 100 slightly rises during the assembly, i.e. it rises by the difference of dimensions A and C. When the electronic component 100 rises as it is attached to the mechanical part 102, the ears 206 in the electronic component 100 are detached from the circuit board 104 surface, i.e. the ears 206 and taps 300 are needed only in the mounting phase for aligning the wire legs 204 of the electronic component 100 and as a mechanical support in the soldering and transportation phase. The rising of the electronic component 100 is enabled in the embodiment by making the electric connecting means 204 of the electronic component 100, i.e. wire legs 204, flexible so that they can slightly bend when the circuit board 104 is mounted in the mechanical part 102.

Figure 8:
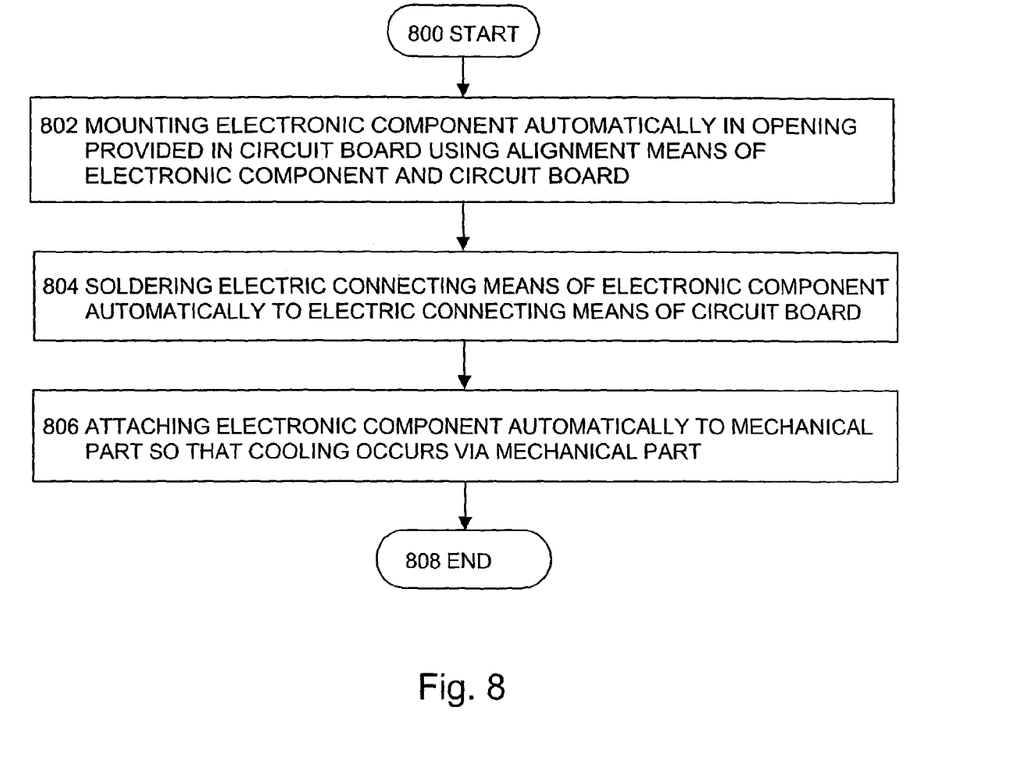
FIG. 8 is a flow chart illustrating a method of producing the electronic unit of the radio system automatically.

Finally, a method of producing an electronic unit of a radio system automatically will be exemplified with reference to the flow chart of FIG. 8. The method enables automatic performance of all the production stages.

The method starts in 800. Then in 802, the electronic component is mounted automatically in a hole provided for the electronic component in the circuit board using alignment means of the electronic component and alignment means of the circuit board. The alignment means of the electronic component and the alignment means of the circuit board align the electric connecting means of the electronic component against the electric connecting means on the circuit board.

Next in 804, the electric connecting means of the electronic component are soldered automatically to the electric connecting means of the circuit board.

After this in 806, the electronic component is attached automatically to the mechanical part so that the electronic component is in contact with the mechanical part, in which case the electronic component is cooled via the mechanical part. The method ends in 808.

The different embodiments of the method can be implemented applying electronic components, circuit boards, mechanical parts, electric connecting means and other attachment means similar to those described in connection with FIGS. 1 to 7, but also other implementations are feasible.

Even though the invention was described above with reference to the example according to the accompanying drawings, it is clear that the invention is not limited to them but it may be modified in various ways within the inventive concept disclosed in the appended claims.

The invention claimed is:

1. A method comprising:
    mounting a electronic component automatically in an opening provided for the electronic component in a circuit board using an alignment unit of the electronic component and an alignment unit of the circuit board, which align an electric connecting unit of the electronic component against an electric connecting unit on the circuit board, wherein mounting comprises mounting the alignment unit of the electronic component on the alignment unit of the circuit board, the alignment unit of the circuit board also being for locating the electronic component with respect to the circuit board;
    providing ears in the alignment unit of the electronic component which extend beyond the edges of the opening provided in the circuit board, wherein aligning the ears directly on the alignment unit of the circuit board during the automatic mounting keep the electronic component in place with respect to the circuit board before the electronic component is attached to a mechanical part;
    arranging the ears in the alignment unit of the electronic component to rest on top of the circuit board upper surface such that the bottom surface of the electronic component is arranged lower than the bottom surface of the circuit board before the electronic component is attached to the mechanical part;
    soldering the electric connecting unit of the electronic component automatically to the electric connecting unit of the circuit board when the bottom surface of the electronic component is arranged lower than the bottom surface of the circuit board; and
    attaching the electronic component automatically in contact with the mechanical part so that the bottom surface of the electronic component is arranged on the same level as the bottom surface of the circuit board while the ears in the alignment unit detach from the circuit board upper surface, in which the electronic component is cooled via the mechanical part.

2. The method according to claim 1, wherein the bottom of the electronic component is against the mechanical part after the attachment of the electronic component to the mechanical part.

3. The method according to claim 1, wherein the electric connecting unit of the electronic component are connecting clamps or wire legs.

4. The method according to claim 1, wherein the electric connecting unit of the circuit board are connecting areas or pads.

5. The method according to claim 1, wherein the electric connecting unit of the electronic component are flexible, in which case the they bend, if necessary, when the electronic component is attached automatically to the mechanical part and when the electronic component moves with respect to the circuit board in a direction perpendicular to the plane of the circuit board.

6. The method according to claim 1, wherein the mechanical part comprises a cooling unit.

7. The method according to claim 1, wherein the alignment unit of the electronic component are taps provided in the ears.

8. The method according to claim 1, wherein the alignment unit of the circuit board are holes provided in the circuit board.

9. An automatically produced electronic unit of a radio system, the electronic unit comprising:
    a mechanical part;
    a circuit board attached to the mechanical part; and an electronic component connected to the circuit board, wherein the electronic component is mounted automatically in an opening provided for the electronic component in the circuit board using an alignment unit of the electronic component and an alignment unit of the circuit board, which align an electric connecting unit of the electronic component against an electric connecting unit on the circuit board, wherein mounting comprises mounting the alignment unit of the electronic component on the alignment unit of the circuit board, the alignment unit of the circuit board also being for locating the electronic component with respect to the circuit board, wherein the alignment unit of the electronic component comprises ears extending beyond the edges of the opening provided in the circuit board, wherein aligning the ears directly on the alignment unit of the circuit board during the automatic mounting keep the electronic component in place with respect to the circuit board before the electronic component is attached to the mechanical part, wherein the ears of the alignment unit of the electronic component are arranged to rest on top of the circuit board upper surface such that the bottom surface of the electronic component is arranged lower than the bottom surface of the circuit board before the electronic component is attached to the mechanical part;

wherein the electric connecting unit of the electronic component is soldered automatically to the electric connecting unit of the circuit board when the bottom surface of the electronic component is arranged lower than the bottom surface of the circuit board, and the electronic component is attached automatically in contact with the mechanical part so that the bottom surface of the electronic component is arranged on the same level as the bottom surface of the circuit board while the ears in the alignment unit detach from the circuit board upper surface, in which the electronic component is cooled via the mechanical part.

10. The electronic unit according to claim 9, wherein the bottom of the electronic component is against the mechanical part after the attachment of the electronic component to the mechanical part.

11. The electronic unit according to claim 9, wherein the electric connecting unit of the electronic component is connecting clamps or wire legs.

12. The electronic unit according to claim 9, wherein the electric connecting unit of the circuit board is connecting areas or pads.

13. The electronic unit according to claim 9, wherein the electric connecting unit of the electronic component is flexible, in which case the electric connecting unit bends, if necessary, when the electronic component is attached automatically to the mechanical part and when the electronic component moves with respect to the circuit board in a direction perpendicular to the plane of the circuit board.

14. The electronic unit according to claim 9, wherein the alignment unit of the electronic component is taps provided in the ears.

15. The electronic unit according to claim 9, wherein the alignment unit of the circuit board is holes provided in the circuit board.

16. An electronic component, comprising:

a mounting unit configured to automatically mount an electronic component in an opening provided for the electronic component in a circuit board using an alignment unit of the electronic component and an alignment unit of the circuit board, which align an electric connecting unit of the electronic component against an electric connecting unit on the circuit board, wherein the mounting unit is configured to mount the alignment unit of the electronic component on the alignment unit of the circuit board, the alignment unit of the circuit board also being for locating the electronic component with respect to the circuit board, wherein the alignment unit of the electronic component comprises ears extending beyond the edges of the opening provided in the circuit board, wherein aligning the ears directly on the alignment unit of the circuit board during the automatic mounting keep the electronic component in place with respect to the circuit board before the electronic component is attached to the mechanical part, wherein the ears of the alignment unit of the electronic component are arranged to rest on top of the circuit board upper surface such that the bottom surface of the electronic component is arranged lower than the bottom surface of the circuit board before the electronic component is attached to the mechanical part;

wherein the electric connecting unit of the electronic component can be automatically soldered to the electric connecting unit of the circuit board when the bottom surface of the electronic component is arranged lower than the bottom surface of the circuit board, and the electronic component can be automatically attached in contact with the mechanical part so that the bottom surface of the electronic component is arranged on the same level as the bottom surface of the circuit board while the ears in the alignment unit detach from the circuit board upper surface, in which the electronic component is cooled via the mechanical part.

17. The electronic component according to claim 16, wherein the bottom of the electronic component is against the mechanical part after the attachment of the electronic component to the mechanical part.

18. The electronic component according to claim 16, wherein the electric connecting unit of the electronic component is connecting clamps or wire legs.

19. The electronic component according to claim 16, wherein the electric connecting unit of the circuit board is connecting areas or pads.

20. The electronic component according to claim 16, wherein the electric connecting unit of the electronic component is flexible, in which case the electric connecting unit bends or yields if necessary when the electronic component is attached automatically to the mechanical part and when the electronic component moves with respect to the circuit board in a direction perpendicular to the plane of the circuit board.

21. An electronic unit of a radio system, comprising:

a mechanical part;

a circuit board attached to the mechanical part; and an electronic component connected to the circuit board, wherein the electronic unit has been produced by a mounting unit configured to mount the electronic component automatically in an opening provided for the electronic component in the circuit board using an alignment unit of the electronic component and an alignment unit of the circuit board, which align an electric connecting unit of the electronic component against an electric connecting unit on the circuit board, wherein the mounting unit is configured to mount the alignment unit of the electronic component on the alignment unit of the circuit board, the alignment unit of the circuit board also being for locating the electronic component with respect to the circuit board, wherein the alignment unit of the electronic component comprises ears extending beyond the edges of the opening provided in the circuit board, wherein aligning the ears directly on the alignment unit of the circuit board during the automatic mounting keep the electronic component in place with respect to the circuit board before the electronic component is attached to the mechanical part wherein the ears of the alignment unit of the electronic component are arranged to rest on top of the circuit board upper surface such that the bottom surface of the electronic component is arranged lower than the bottom surface of the circuit board before the electronic component is attached to the mechanical part, and by a soldering unit configured to solder the electric connecting unit of the electronic component automatically to the electric connecting unit of the circuit board when the bottom surface of the electronic component is arranged lower than the bottom surface of the circuit board, and configured to attach the electronic component automatically in contact with the mechanical part so that the bottom surface of the electronic component is arranged on the same level as the bottom surface of the circuit board while the ears in the alignment unit detach from the circuit board upper surface, in which the electronic component is cooled via the mechanical part.

22. The electronic unit according to claim 21, wherein the bottom of the electronic unit is against the mechanical part after the attachment of the electronic component to the mechanical part.

23. The electronic unit according to claim 21, wherein the electric connecting unit of the electronic component are connecting clamps or wire legs.

24. The electronic unit according to claim 21, wherein the electric connecting unit of the circuit board are connecting areas or pads.

25. The electronic unit according to claim 21, wherein the electric connecting unit of the electronic component are flexible, in which case the they bend, if necessary, when the electronic component is attached automatically to the mechanical part and when the electronic component moves with respect to the circuit board in a direction perpendicular to the plane of the circuit board.

26. An apparatus, comprising:

mounting means for automatically mounting an electronic component in an opening provided for the electronic component in a circuit board using an alignment unit of the electronic component and an alignment unit of the circuit board, which align an electric connecting unit of the electronic component against an electric connecting unit on the circuit board, wherein mounting comprises mounting the alignment unit of the electronic component on the alignment unit of the circuit board, the alignment unit of the circuit board also being for locating the electronic component with respect to the circuit board, wherein the alignment unit of the electronic component comprises ears extending beyond the edges of the opening provided in the circuit board, wherein aligning the ears directly on the alignment unit of the circuit board during the automatic mounting keen the electronic component in place with respect to the circuit board before the electronic component is attached to the mechanical part, wherein the ears of the alignment unit of the electronic component are arranged to rest on top of the circuit board upper surface such that the bottom surface of the electronic component is arranged lower than the bottom surface of the circuit board before the electronic component is attached to the mechanical part;

wherein the electric connecting unit of the electronic component can be automatically soldered to the electric connecting unit of the circuit board when the bottom surface of the electronic component is arranged lower than the bottom surface of the circuit board, and the electronic component can be automatically attached in contact with the mechanical part so that the bottom surface of the electronic component is arranged on the same level as the bottom surface of the circuit board while the ears in the alignment unit detach from the circuit board upper surface, in which the electronic component is cooled via the mechanical part.

* * * * *